United States Patent [19]

Ollenbach

[11] 4,102,481
[45] Jul. 25, 1978

[54] SEALING PRESS FOR AUTOMATED ASSEMBLY APPARATUS

[75] Inventor: Ernest C. Ollenbach, Phoenix, Ariz.

[73] Assignee: Motorola, Inc., Schaumburg, Ill.

[21] Appl. No.: 743,381

[22] Filed: Nov. 19, 1976

Related U.S. Application Data

[63] Continuation of Ser. No. 575,771, May 8, 1975, abandoned.

[51] Int. Cl.² ........................................... H01L 21/52
[52] U.S. Cl. ......................... 228/6 R; 228/44.1 A; 228/49; 228/47; 29/588; 29/742; 29/743; 65/155; 425/444
[58] Field of Search ................. 228/6 A, 6 R, 47, 49, 228/44.1 A; 29/588, 589, 742, 729, 741, 743, 759; 65/154, 155; 425/444

[56] References Cited

U.S. PATENT DOCUMENTS

| 3,382,342 | 5/1968 | Dix et al. ........................ 219/385 D |
| 3,436,201 | 4/1969 | Tsuji et al. ........................... 65/155 |
| 3,551,127 | 12/1970 | Stoll .................................. 65/155 X |
| 3,696,986 | 10/1972 | Anderson et al. ................. 29/588 X |
| 3,711,939 | 1/1973 | Stoll ...................................... 228/246 |

*Primary Examiner*—Al Lawrence Smith
*Assistant Examiner*—K. J. Ramsey
*Attorney, Agent, or Firm*—John A. Fisher

[57] ABSTRACT

Sealing apparatus for the automatic assembly of integrated circuit packages. The semiconductor device package is comprised of an upper and lower ceramic cover, and a metal lead frame having mounted thereon the integrated circuit. The automatic ceramic sealing apparatus provides a good quality hermetic seal of the integrated circuit within the ceramic covers by including continuously heated sealing presses mounted on a rotary dial table.

5 Claims, 12 Drawing Figures

SEALING PRESS FOR AUTOMATED ASSEMBLY APPARATUS

This is a continuation, of application Ser. No. 575,771, filed May 8, 1975, abandoned.

BACKGROUND OF THE INVENTION

1. Field of Invention

This invention relates to apparatus which provides for the automatic assembly of semiconductor devices such as an integrated circuit within a ceramic package, and more particularly to apparatus which provides a precise temperature cycle for parts being assembled.

2. Description of Prior Art

In the manufacture of semiconductor devices such as an integrated circuit an assembly procedure is required whereby protective covers must be assembled to a mechanical base which has the integrated circuit mounted thereon. Due to the miniaturization of these parts a logical method of assembling the mechanical parts leads to a process whereby heat is applied and sealing material strategically positioned on the parts is caused to melt and then rapidly solidify after being adhered to two or more mating surfaces.

Such methods involve the application of heat via conduction, convection or radiation; or any combination thereof. Most often utilized is a combination of radiation and convective heat transfer because of the problems associated with handling the production parts.

Prior art apparatus utilized to hermetically seal ceramic encapsulated packages were almost completely manual in operation. Production pieces were manually loaded on a handling fixture and loaded into a heated oven or furnace for a prescribed period of time. At the end of the heated cycle a cooling operation was directed to lower the temperature of the handling fixture containing the finished production pieces. This method of cooling is relatively slow and inefficient since the handling fixtures are relatively massive as contrasted to the small size of the semiconductor parts.

Recent emphasis has been placed on the development of methods and apparatus for accurately controlling process parameters where the application of heat is utilized as a means to seal production packages. Reliability studies indicate that the method of heat application for sealing purposes is an important factor in determining the strength and hermeticity of the seal.

The process of conductive heat transfer which is utilized in the instant invention is more effective since the parts to be assembled encounter a uniform heat flux within a precise temperature cycle. An improvement remaining to be made with conductive heat transfer utilized in the instant invention would be to eliminate the air film between the heated source and the part to be assembled.

SUMMARY OF THE INVENTION

The foregoing and other shortcomings and problems of the prior art are overcome, in accordance with the present invention, by an automatically operated assembly apparatus which provides precise fixturing, automatic handling and accurately controlled conductive heating and cooling of the production pieces.

According to an aspect of the present invention, apparatus is provided for automatically assembling semiconductor integrated circuits hermetically within covers of ceramic material. A rotary dial table having mounted thereon a plurality of similar presses to fixture and heat production pieces is automatically indexed with subsequent dwell to provide for prescribed production assembly operations.

According to still another aspect of the present invention, suitable fixturing provides for conductively heating the ceramic covers and simultaneously isolating the lead frame containing the integrated circuit.

According to another aspect of the present invention, an appropriate pressure is applied to covers which house the integrated circuit to assure a continuous seal.

According to still another aspect of the present invention, production pieces are automatically stripped from their heated assembly die and retained for automated cooling prior to automatic removal from the assembly apparatus.

In summary, the instant invention comprises apparatus which automatically heats ceramic covers to hermetically seal a plurality of semiconductor circuits simultaneously on a common lead frame section. A low temperature sealing glass composition is heated conductively on the ceramic covers causing this sealing substance to become molten.

BRIEF DESCRIPTION OF THE DRAWINGS

The foregoing and other aspects of the present invention will be understood more fully from the following detailed description of the preferred embodiment of the present invention in conjunction with the accompanying drawings, in which.

COMPLETE DESCRIPTION

Figure 2:
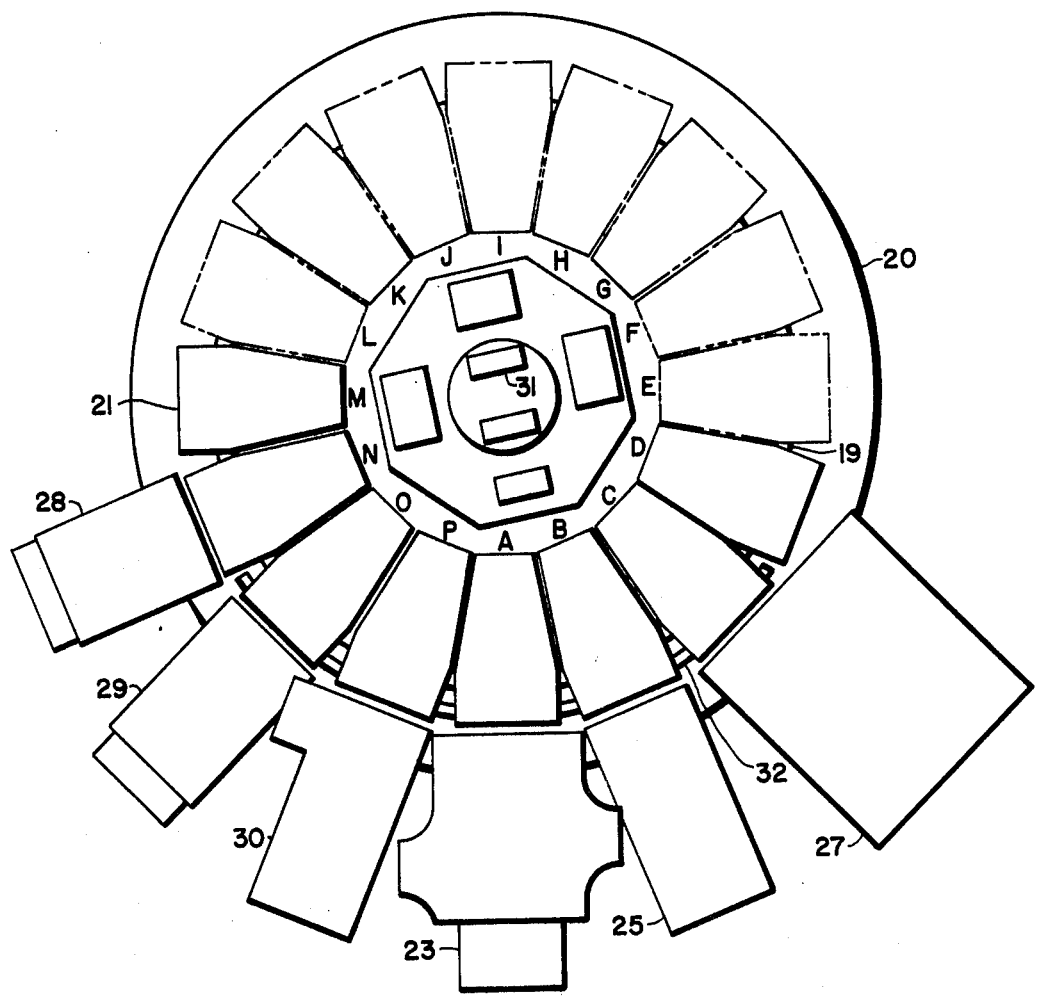
FIG. 2 is a plan view of the assembly apparatus.
Figure 1:
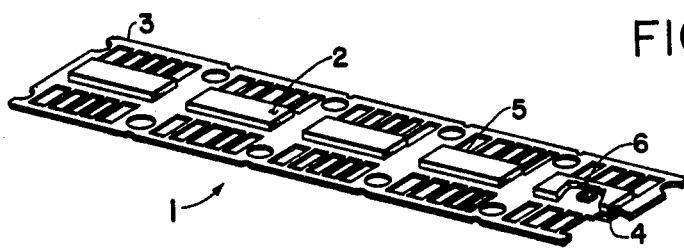
FIG. 1 is a perspective view of a strip of devices assembled in accordance with the invention.

In FIG. 1, a strip 1 of integrated circuit packages 2 (five in number being shown) is assembled from a lead frame strip 3, a plurality of base covers 4 and a plurality of top covers 5. The top covers 5 are suitably recessed to accommodate a semiconductor chip 6 mounted on a support plate of the lead frame 3. The peripheral areas of the ceramic members 4 and 5 are painted or coated with a sealing glass material so that when the parts are placed together and heat and pressure applied, a hermetic seal is formed between the covers about the semiconductor chip 6 and to the lead frame strip 3. Following this assembly the lead frame is separated into the individual components and the leads formed in a manner that is well known.

The sealing glass material is preferably of the type disclosed in U.S. application Ser. No. 409,853 Davis et al. entitled SOLDER GLASS COMPOSITION AND METHOD OF USING SAME FOR ENCAPSULATING DEVICES filed Oct. 26, 1973, now U.S. Pat. No. 3,964,920, and assigned to same assignee as herein.

An assembly machine 17 for assembling the strip 1 of integrated circuit devices in accordance with the invention is a sixteen position indexed rotary dial table 18 which dial table includes a rotary dial 19 and a stationary tooling table 20 such as indicated for convenience as comprising sixteen work stations A through P. Sixteen identical heat sealing presses 21 are mounted upon the rotary dial 19. A ceramic parts loader 23 is mounted on tooling table 20 adjacent station A. Adjacent station B is mounted an alignment machine 25 while adjacent station C is a lead frame loader 27. A tamper 28 is mounted adjacent to station N while adjacent station O is a cooling blower 29 and an unloader 30 is provided at station P. Appropriate control device are mounted within the center stack 31 of the assembly apparatus 17 while the primary cam 32 is mounted on tooling table 20 and extends from station O through station C.

The rotary dial table 19 utilizes a drive system, located within the assembly station 17 supporting structure, to provide slow starts and slow stops during the indexing operation. The dial table 19 positions the heat and seal press 21 to within 0.0006 linear inch, of a specified rotary index position.

Figure 3:
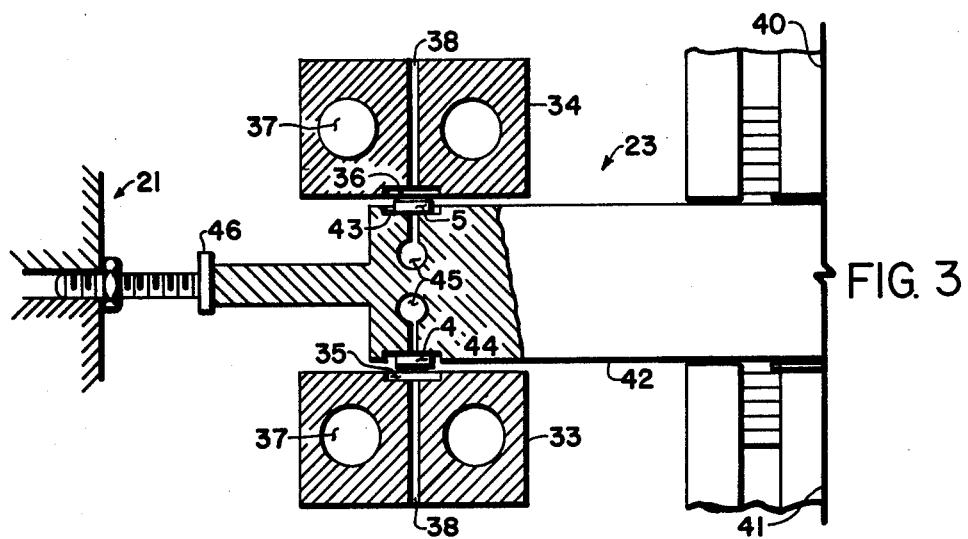
FIG. 3–5 and 9–10b are side views of sealing press portions of the assembly apparatus at successive stages in the assembly operation.

Each sealing press 21 has a lower electrically heated cavity die block 33 and a relatively moveable upper cavity die block 34 (FIG. 3). Die blocks 33 and 34 have a plurality of cavities 35 and 36 within upper and lower surfaces respectively for receiving the parts to be assembled from loader 23. Electric heater coils 37 and vacuum ports 38 are provided through the body of the die blocks. At station A the loader 23 includes a plurality of upper magazines 40 and lower magazines 41 containing a supply of parts 4, 5. A loading arm 42 has cover receiving cavities 43, 44 provided in upper and lower surfaces. Each of the cavities is provided with a vacuum port 45. Thus, at each dwell point of the rotary die table, the loading arm 42 receives a plurality of pairs of upper covers 5 and lower covers 4 and reciprocates between a die blocks 33, 34. A stop 46 engages arm 42 to locate the parts above and below cavities 35 and 36 in the die blocks. With vacuum maintained in ports 38 of the die blocks, the vacuum is cut off in ports 45 and the cover parts are thereby transferred to the die blocks 33, 34.

Figure 4:
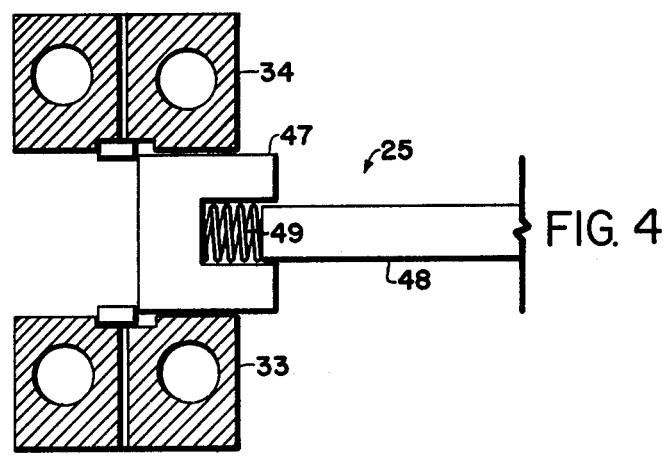
Figure 5:
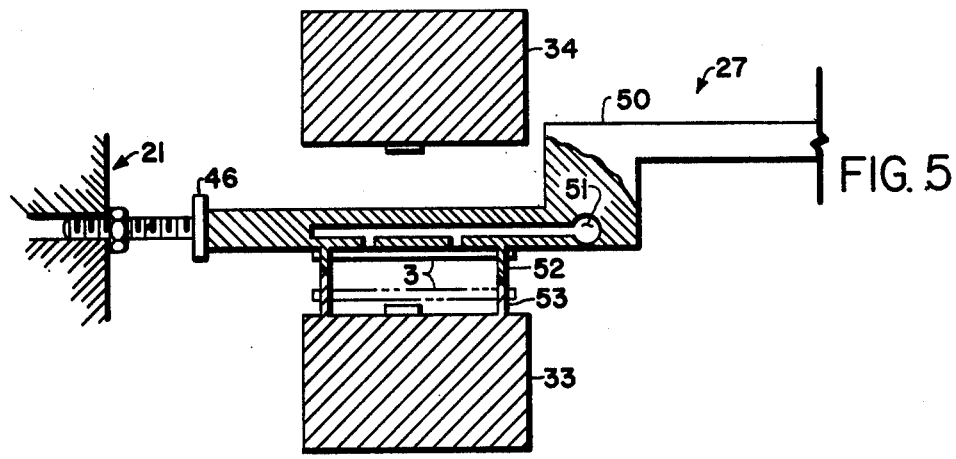

At station B the aligner 25 includes a pusher block 47 mounted on a carrier arm 48 (FIG. 4). The ram 47 is connected movably with respect to the ram 48 by a spring 49. Thus, the aligner 25 positively locates the lid members 4, 5 against one edge of the cavities 35, 36.

At the station C, the lead frame loader 27 includes a reciprocating arm 50 having vacuum ports 51 and alignment pins 52 for picking up a lead frame 3 from a supply magazine and reciprocating between die blocks 33 and 34 to place the lead frame in the heat seal press 21. Lower die block 33 is provided with alignment pins 53 which positively locate the lead frame on the lower die block. This is aided by the inner end 54 of the reciprocating arm 50 coming against stop 46 at which time the vacuum is released from port 51 and the lead frame is permitted to drop onto the die block 33.

While the actual dimensions are exaggerated in the drawing for illustration purposes, it should be noted that the thickness of covers 4 and 5 is greater than the depth of cavities 35 and 36. Thus the lead frame 3 and chips 6 are out of direct contact with die blocks 33 and 34.

Figure 6:
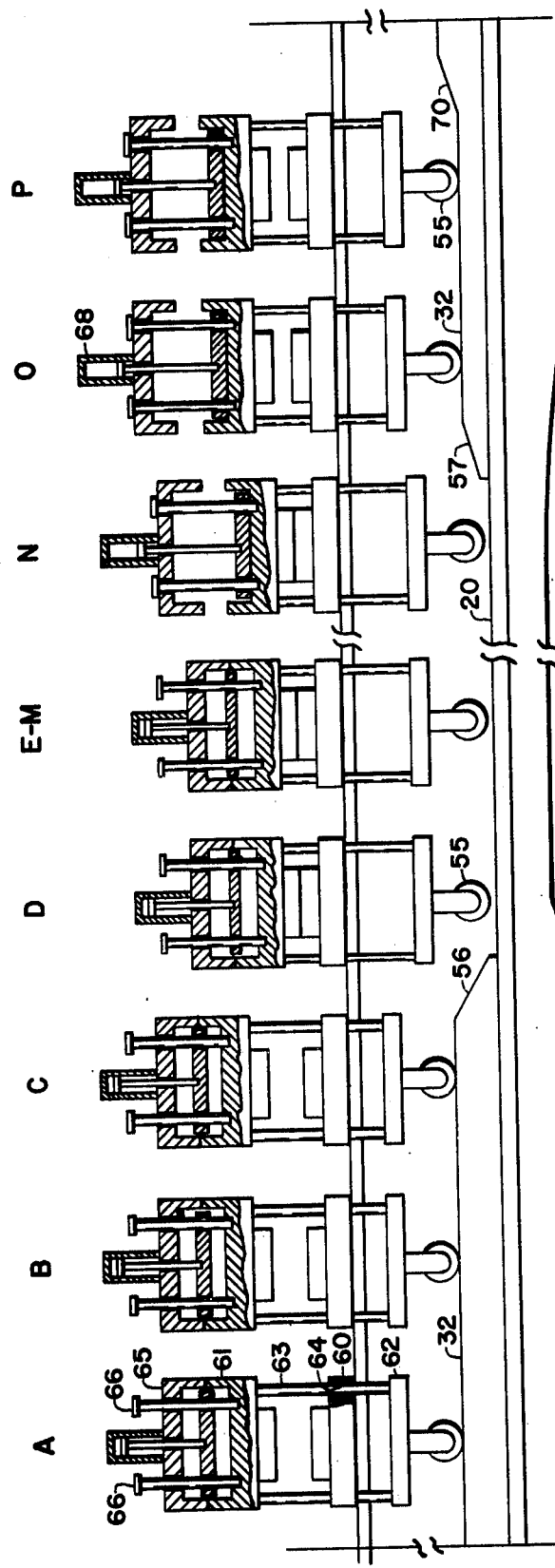
FIG. 6 is an unrolled side view of the assembly apparatus.

As each sealing press 21 moves from station C to station D, a cam follower 55 (FIG. 6) rolls down incline 56 of stationary cam 32 to bring die block 34 into engagement with die block 33, thus enclosing the parts to be assembled. The die blocks are continuously heated, so the cover members 4 and 5 coming in contact with the die blocks begin to rapidly heat even while the die blocks are open from station A to C (FIG. 7) and nearly obtain the sealing temperature of approximately 400° during that dwell period. The sealing temperature of the parts is maintained through stations E to M to assure smooth adherence between the sealing glass layers on each of the covers. A final seal between the members is assured by tamper 29 at station N before the die cavities 33 and 34 open as a result of the movement of the cam follower 55 up the ramp 57 to station O.

Each of the sealing presses 21 (FIG. 6) include a base plate 60 attached to rotary table 19 which supports die block 33. A moveable support plate 61 has attached thereto the die block 34. The support plate 61 is rigidly attached to a cam follower plate 62 by a pair of slide rods 63 supported in bearing sleeves 64 and base plate 60. The cam follower 55, which for convenience is a roller is attached to cam plate 62. Thus, predetermined by the length of slide rods 63 and the height of cam 32, the support plate 61 and hence die block 34 are maintained a predetermined distance above die block 33. An ejector support plate 65 is maintained in alignment with moveable support plate 61 by slide pins 66, the lower ends 67 of which are fixed to moveable support plate 61. The operation of the ejector pins will be explained in further detail hereinafter.

Figure 7:
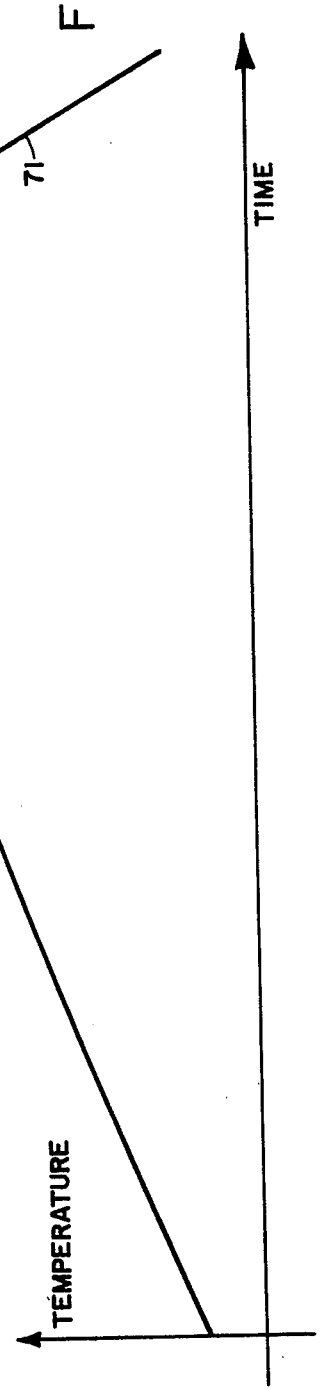
FIG. 7 is a graph, illustrating the temperature profile during assembly.

The ejector support plate 65 has attached thereto an air cylinder 68 which upon actuation effects a raising of the ejector support plate 65 from contact with the moveable support plate 61 prior to station N. As the sealing press 21 opens upon movement to station O a cooling member 31 effectuates rapid cooling of the now sealed part prior to its removal at station P. The cam follower 55 then rises upon another incline 70 of stationary cam 32 to effectuate opening of the cavities to the load position at station A. The temperature attained by the covers as they move through the assembly machine is depicted by the curve 71 (FIG. 7). The temperature of the covers begins to rise at station A when they are placed in the cavities of the heated die blocks 33 and 34. The cover temperature rises to the sealing temperature (approximately 400° C) at station D when the die blocks are closed. The covers are maintained at the sealing temperature through stations E-N and then begin to cool at station O when the die blocks open. The die blocks 33 and 34 are continuously heated, the temperature of the covers begins to rise immediately upon placement in the die block cavities at station A and continues to rise until the die blocks are closed at station D where upon they almost immediately attain the sealing temperature of the die blocks approximately 400° C and are maintained at that temperature through station N until the opening of the die blocks and the cooling at station O takes place bring the parts down to a relatively low temperature by the time of removal at station P. Air cylinder 68 is actuated a predetermined time after the parts have reached sealing temperature.

Figure 8:
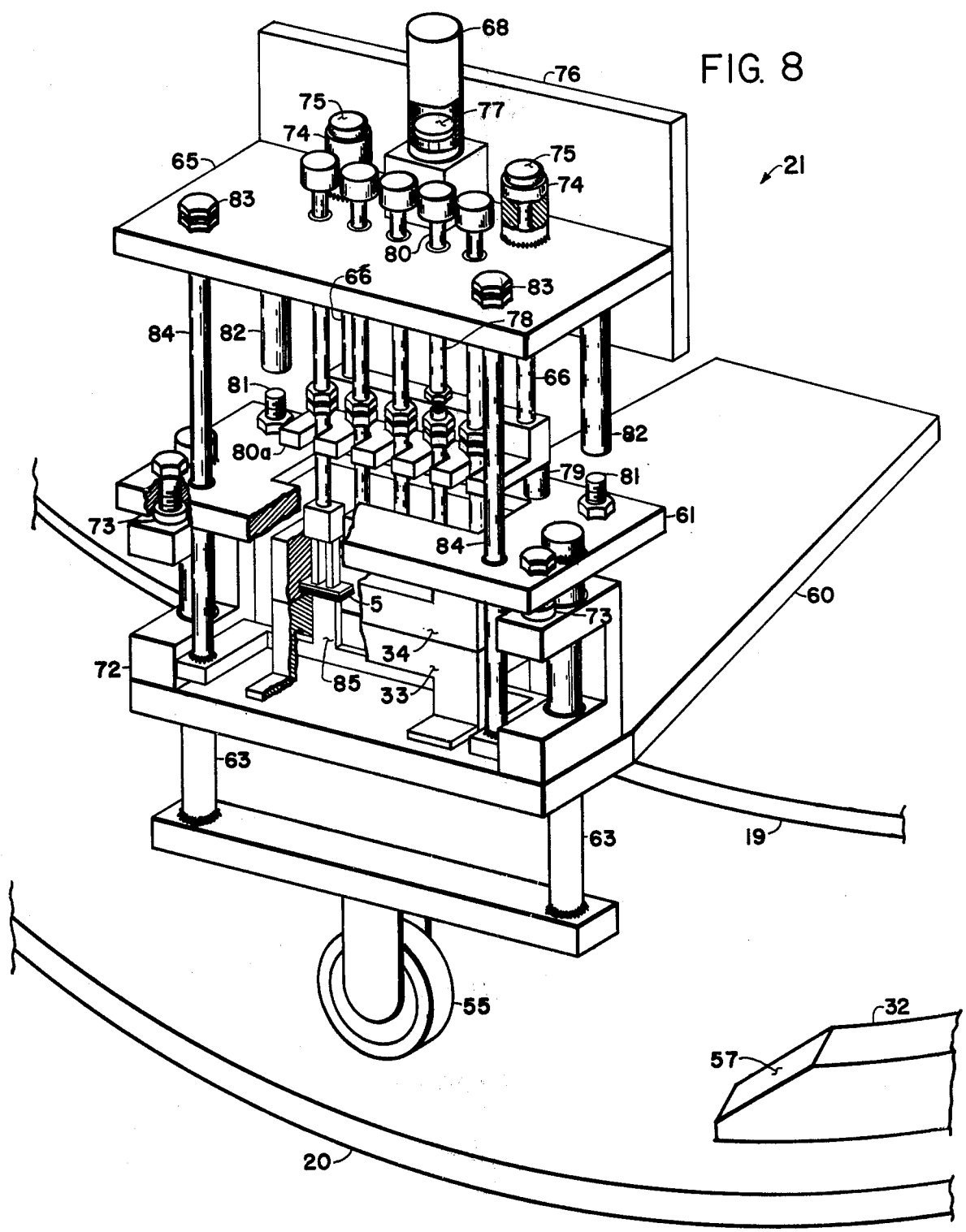
FIGS. 8 and 11 are front and back perspective views in greater detail of a sealing press.

A perspective view of a sealing press 21 is shown in greater detail in FIG. 8. As before noted, die block 33 is rigidly supported on base plate 60 which in turn is fixedly supported by the dial table 19. Die block 34 is rigidly attached to support plate 61 which is slideably mounted by C-shaped bearing supports 72 afixed to the base plate 60 and which cooperate with slide rods 63 to guide moveable plate 61 in its travel as controlled by a cam follower 55. A pair of stops 73 cooperate with upper surfaces of C-shaped bearing supports 72 to limit downward travel of mounting plate 61 and hence cavity block 34.

Ejector control plate 65 is mounted for travel on slide rods 66 through bearing sleeves 74 which are secured to the upper surface of control plate 65. The upper end of slide rods 66 terminate in nail head stops 75 and the lower end of slide rod 66 is secured in support plate 61. A backing plate 76 is secured to control plate 65 so that air cylinder 68 is rigidly secured to control plate 65 and to backing plate 76.

Piston 77 of air cylinder 68 is shown in its actuated position. Thus shaft 78 of piston 77 is afixed to tamping pin control fingers 80a which has moved downwardly on slide rods 66 until contacting stops 79. Thus, the full weight of tamping rods 80 rest on the semiconductor parts. With the travel of shaft 78 stopped by contact with steps 79, continued movement of piston 77 effects a lifting of ejector control plate 65 removing it from its rest position between stops 81 mounted on support plate 61 and pins 82 which are mounted on the underside of control plate 65. As control plate 65 moves upwardly, the upper ends 83 of pull rods 84 are engaged, thus lifting ejector pins 85 into contact with the semiconductor devices within the die blocks. This places the sealing press 21 in the actuated position of station N.

Figure 9:
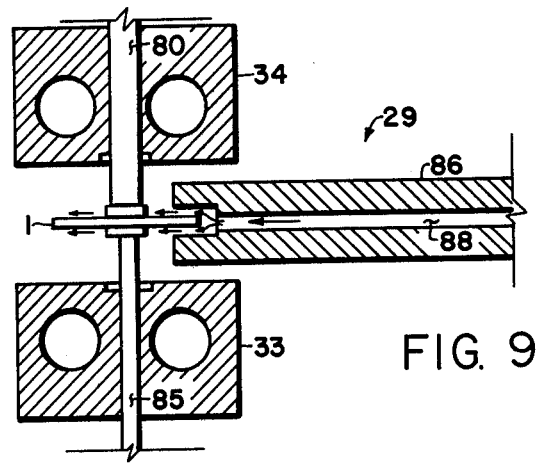

When the sealing press 21 moves to station O, cam follower 55 effects a lifting of not only support plate 61 but also control plate 65 (through stops 79 and shaft 78). This effects a lifting of the ejector pins 85 through pull rods 84, and in turn lifts the semiconductor parts out of the cavities in lower die block 33 while tamping rods 80 remain on the semiconductor parts to remove them from upper die block 34. Ejector pins 85 and tamping rods 80 work together to hold the semiconductor parts in their intermediate position between the die blocks for cooling (FIG. 9).

Cooling apparatus 29 comprises a reciprocating ram 86 having a plurality of orifices 87 adjacent its inner edge supplied with a source of air pressure. Thus, with the semiconductor parts lifted to a position intermediate die blocks 33 and 34 by ejector pins 85 cooling air surrounds the semiconductor parts to rapidly reduce their temperature to a reasonably low level of approximately 150° prior to their removal from sealing press 21 at station P.

Figure 10A:
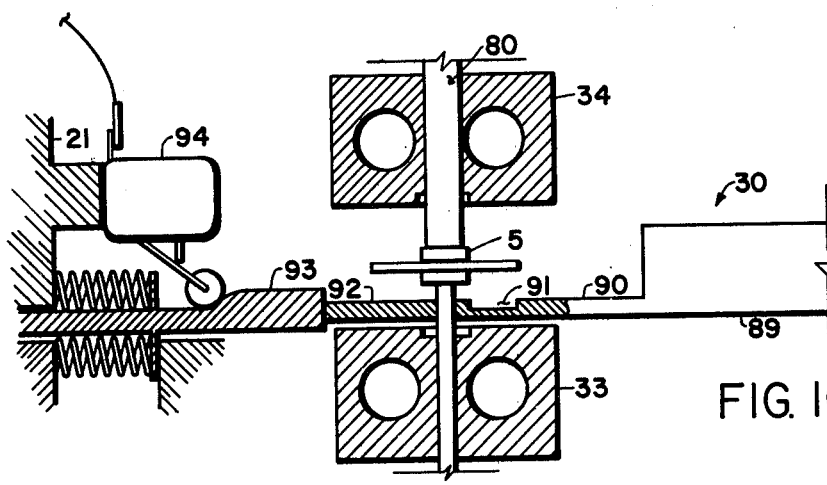
Figure 10B:
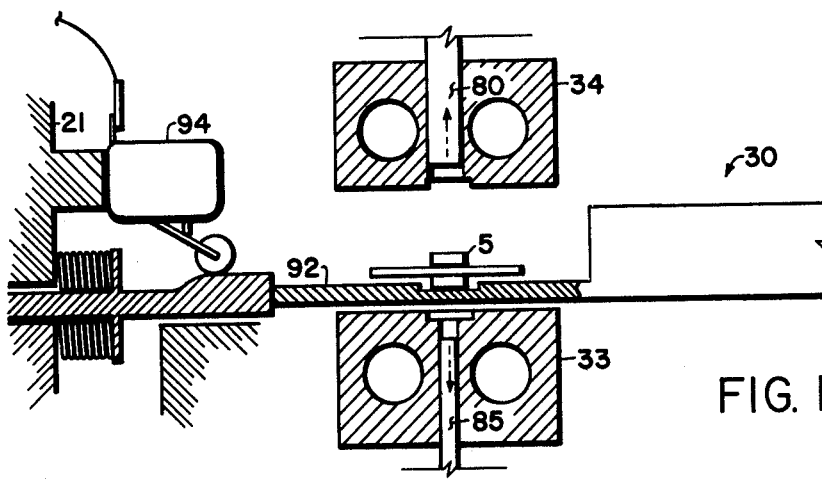

At station P, unloader 30 (FIG. 10) comprises a reciprocating ram 89 supporting a plurality of fingers 90 having cavities 91 in an upper surface for receiving the semiconductor devices. At least one of the fingers 90 is provided with an extension 92 for contacting an actuator 93 for a microswitch 94 mounted on the sealing press 21. Thus, as ram member 89 reciprocates into position between die blocks 33 and 34 with fingers 90 underneath the semiconductor devices, the extension 92 contacts actuator 93 (FIG. 10A). As actuator 93 moves, microswitch 94 is closed to actuate air cylinder 68 and release ejector pins 85 and tamping pins 80 from contact with the semiconductor devices. The device then rest in cavities 91 of the unloader 30. The ram 89 then withdraws from between the cavities and the sealing press 21 has then been unloaded and proceeds to station A.

Referring back to FIG. 8, when microswitch 94 has been actuated, the piston 77 begins to rise in air cylinder 68 permitting control plate 65 to lower until stops 81 and 82 come in contact removing the ejector pins 85 from contact with the semiconductor devices. Continued actuation of piston 77 effects, through shaft 78, a raising of tamper support pins 80 by the pin actuator fingers 80A to lift tamper fingers 80 back into die block 34 so as to not interfere with loading at station A.

Figure 11:
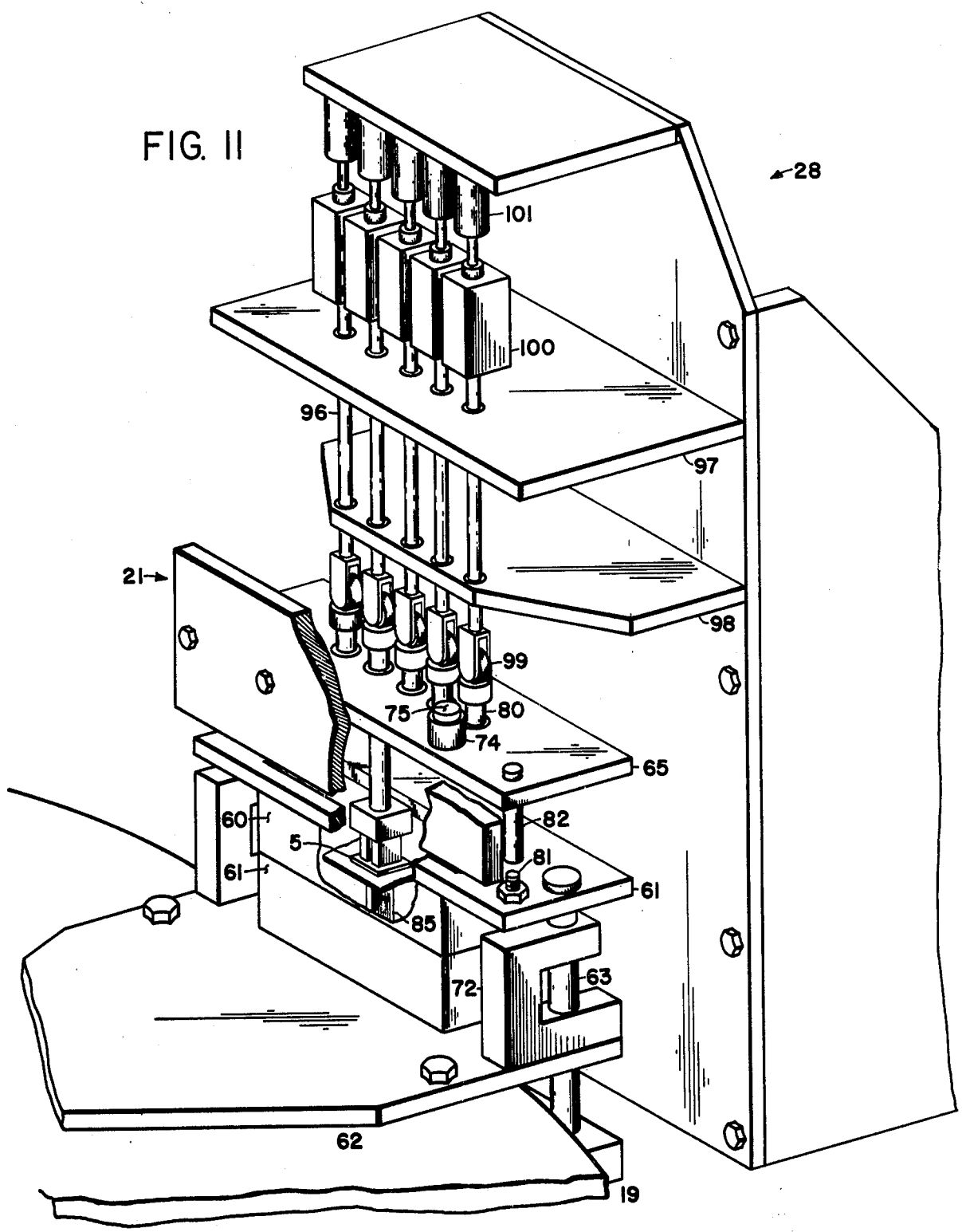

Referring back to FIG. 6 it will thus be seen that at station A die block support plate 61 is in its upper position. Control plate 65 is in its lowered position relative to support plate 61 and piston 77 of air cylinder 68 is in its raised position maintaining tamper pins and ejection pins within the cavity die blocks for loading at station A, aligning at station B, and loading the lead frame at station C. At station D support plate 61 and hence control plate 65 lower to close die blocks 33 and 34 which position is maintained through stations E to M. Air cylinder 68 may be actuated at station E if desired. At station N a tamper 28 is provided to assure positive sealing of the parts which tamper is shown in greater detail in FIG. 11.

Tamper 28 comprises a main support frame 95 carrying a number of push rods 96 corresponding to the number of tamping rods 80 provided by the sealing press 21. Each push rod 96 is slidably supported within bearing plates 97 and 98 supported by main frame 95. The lower end of push rods 96 are provided with rollers 99 which contact the upper end of tamping rods 80 while the upper ends are provided with weights 100 which apply predetermined pressure to the tamping rods 80. After the sealing press 21 has arrived at a stationary dwell position at the tamper 28, pulsating air hammers 101 apply a vibratory motion to the weight 100 to assure a final smooth seal of the parts.

While the invention has been disclosed by way of the preferred embodiment thereof it will be appreciated that suitable modifications may be made therein without departing from the spirit and scope of the invention.

What is claimed is:
1. A press for sealing upper and lower ceramic members to a metal member, comprising:
   (1) upper and lower die block members, each configured to receive the upper and lower ceramic members, respectively;
   (2) means for automatic loading of said upper and lower ceramic members into said upper and lower die block members;
   (3) means for aligning said upper and said lower ceramic members;
   (4) means for aligning said metal member between said aligned ceramic members;
   (5) means for applying heat to each of said upper and lower ceramic members by means of said upper and lower die block members;
   (6) means for applying pressure to said upper and lower ceramic members by means of said upper and lower die block members;
   (7) means for separating said upper and lower ceramic members from said upper and lower die block members;
   (8) means for holding said upper and lower ceramic members in an intermediate position between said upper and lower die block members when said upper and lower die block members are separated.

2. The press of claim 1 and further comprising means for cooling said ceramic members after sealing to said metal member.

3. The press of claim 1 wherein said means for automatic loading of said upper and lower ceramic members comprises;
   an upper magazine and a lower magazine containing a plurality of said upper and lower ceramic members, respectively;
   a loading arm having cavities for receiving said ceramic members from said magazines;

vacuum means for holding said ceramic members in said cavities;

means for reciprocating said loading arm from a position adjacent said magazines to a position between said die block members;

means for transferring said ceramic members from said loading arm to said die block cavities.

4. A press providing for the automatic stripping and containment of production pieces from a pair of heated cavity die blocks fixedly mounted to a first plate and a second plate, respectively; comprising a mechanism including said first and second plates, and a third plate, all plates tiered in parallel; said first plate being fixedly mounted, said second plate being slideably mounted to said first plate, and having three dwell states with respect to said first plate and actuated by mechanical means, said third plate being slideably mounted to said second plate, and having two dwell states with respect to said second plate, and slideably attached members causing said stripping and containment of production pieces from said heated cavity die blocks.

5. A press as recited in claim 4 wherein said mechanical actuating means is an air cylinder.

* * * * *